(12) United States Patent
Hsieh et al.

(10) Patent No.: US 11,747,395 B2
(45) Date of Patent: *Sep. 5, 2023

(54) BOARD-LIKE CONNECTOR, SINGLE-ARM BRIDGE OF BOARD-LIKE CONNECTOR, AND WAFER TESTING ASSEMBLY

(71) Applicant: CHUNGHWA PRECISION TEST TECH. CO., LTD., Taoyuan (TW)

(72) Inventors: Kai-Chieh Hsieh, Taoyuan (TW); Chao-Chiang Liu, Taoyuan (TW); Meng-Chieh Cheng, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 118 days.

This patent is subject to a terminal disclaimer.

(21) Appl. No.: 17/485,268

(22) Filed: Sep. 24, 2021

(65) Prior Publication Data

US 2022/0137124 A1    May 5, 2022

(30) Foreign Application Priority Data

Nov. 3, 2020   (TW) ................. 109138184

(51) Int. Cl.
*G01R 31/28*      (2006.01)
*H01R 12/71*      (2011.01)

(52) U.S. Cl.
CPC ....... *G01R 31/2889* (2013.01); *H01R 12/714* (2013.01)

(58) Field of Classification Search
CPC .. H01R 12/714; H01R 13/2442; H01R 12/73; G01R 31/2889; G01R 31/2831
See application file for complete search history.

(56) References Cited

U.S. PATENT DOCUMENTS

| | | | |
|---|---|---|---|
| 10,998,662 B2* | 5/2021 | Chen | H01R 12/714 |
| 11,561,244 B2* | 1/2023 | Hsieh | G01R 1/07378 |
| 2001/0004556 A1* | 6/2001 | Zhou | H01R 13/2407 |
| | | | 439/71 |
| 2008/0074132 A1* | 3/2008 | Fan | G01R 1/07342 |
| | | | 324/755.06 |
| 2020/0088764 A1* | 3/2020 | Lee | G01R 1/0416 |
| 2022/0140515 A1* | 5/2022 | Hsieh | H01R 13/2457 |
| | | | 324/762.01 |

\* cited by examiner

*Primary Examiner* — Jermele M Hollington
*Assistant Examiner* — Suresh K Rajaputra
(74) *Attorney, Agent, or Firm* — Li & Cai Intellectual Property (USA) Office

(57) ABSTRACT

A board-like connector, a single-arm bridge of a board-like connector, and a wafer testing assembly are provided. The board-like connector includes a plurality of single-arm bridges spaced apart from each other and an insulating layer. Each of the single-arm bridges includes a carrier, a cantilever extending from and being coplanar with the carrier, an abutting column, and an abutting end portion, the latter two of which extend from the cantilever and are respectively arranged at two opposite sides of the cantilever. The insulating layer connects the carriers of the single-arm bridges, and the abutting column of each of the single-arm bridges protrudes from the insulating layer. The abutting column and the abutting end portion of each of the single-arm bridges are configured to abut against two boards, respectively.

10 Claims, 12 Drawing Sheets

BOARD-LIKE CONNECTOR, SINGLE-ARM BRIDGE OF BOARD-LIKE CONNECTOR, AND WAFER TESTING ASSEMBLY

CROSS-REFERENCE TO RELATED PATENT APPLICATION

This application claims the benefit of priority to Taiwan Patent Application No. 109138184, filed on Nov. 3, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing assembly, and more particularly to a board-like connector, a single-arm bridge of a board-like connector, and a wafer testing assembly.

BACKGROUND OF THE DISCLOSURE

A conventional wafer testing device includes a testing circuit board electrically coupled to a testing apparatus and a signal transmission board that is disposed on the testing circuit board. In the conventional wafer testing device, the signal transmission board is soldered and fixed to the testing circuit board. However, when the signal transmission board is soldered to the testing circuit board, the conventional wafer testing device is easily damaged from thermal shock. Moreover, the signal transmission board and the testing circuit board are not suited to inspection and maintenance due to their being fixed to each other.

SUMMARY OF THE DISCLOSURE

In response to the above-referenced technical inadequacy, the present disclosure provides a board-like connector, a single-arm bridge of a board-like connector, and a wafer testing assembly to effectively improve on the issues associated with conventional wafer testing devices.

In one aspect, the present disclosure provides a wafer testing assembly, which includes a signal transmission board configured to be connected to a probe head, a testing circuit board configured to be electrically coupled to a testing apparatus, and a board-like connector that is sandwiched between the signal transmission board and the testing circuit board. The board-like connector includes a plurality of single-arm bridges spaced apart from each other and an insulating layer. Each of the single-arm bridges includes a carrier, a cantilever extending from an inner lateral wall of the carrier along a first direction and being coplanar with the carrier, an abutting column extending from the cantilever along a second direction perpendicular to the first direction, and an abutting end portion curvedly that extends from a distal end of the cantilever. In each of the single-arm bridges, the abutting end portion is spaced apart from the abutting column along the first direction. The insulating layer connects the carriers of the single-arm bridges, and the abutting column of each of the single-arm bridges protrudes from the insulating layer. The abutting columns of the single-arm bridges abut against one of the signal transmission board and the testing circuit board, and the abutting end portions of the single-arm bridges abut against another one of the signal transmission board and the testing circuit board. The signal transmission board and the testing circuit board are electrically coupled to each other through the board-like connector.

Therefore, in the wafer testing assembly (or the board-like connector) of the present disclosure, the abutting column and the abutting end portion of any one of the single-arm bridges elastically abut against two boards (e.g., the signal transmission board and the testing circuit board) by being in cooperation with the cantilever, thereby without using any soldering manner. Moreover, any one of the single-arm bridges is detachably abutting against the two boards, so that the components of the wafer testing assembly can be easily separated from each other for facilitating the inspection and maintenance of the wafer testing assembly.

Specifically, in the wafer testing assembly (or the board-like connector) of the present disclosure, the cantilever of any one of the single-arm bridges is coplanar with the carrier for increasing the manufacturing yield of the board-like connector, and when the cantilever of any one of the single-arm bridges is bent by receiving an external force, a stress would be uniformly distributed on the cantilever, thereby effectively decreasing the breaking possibility of the cantilever from the carrier.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
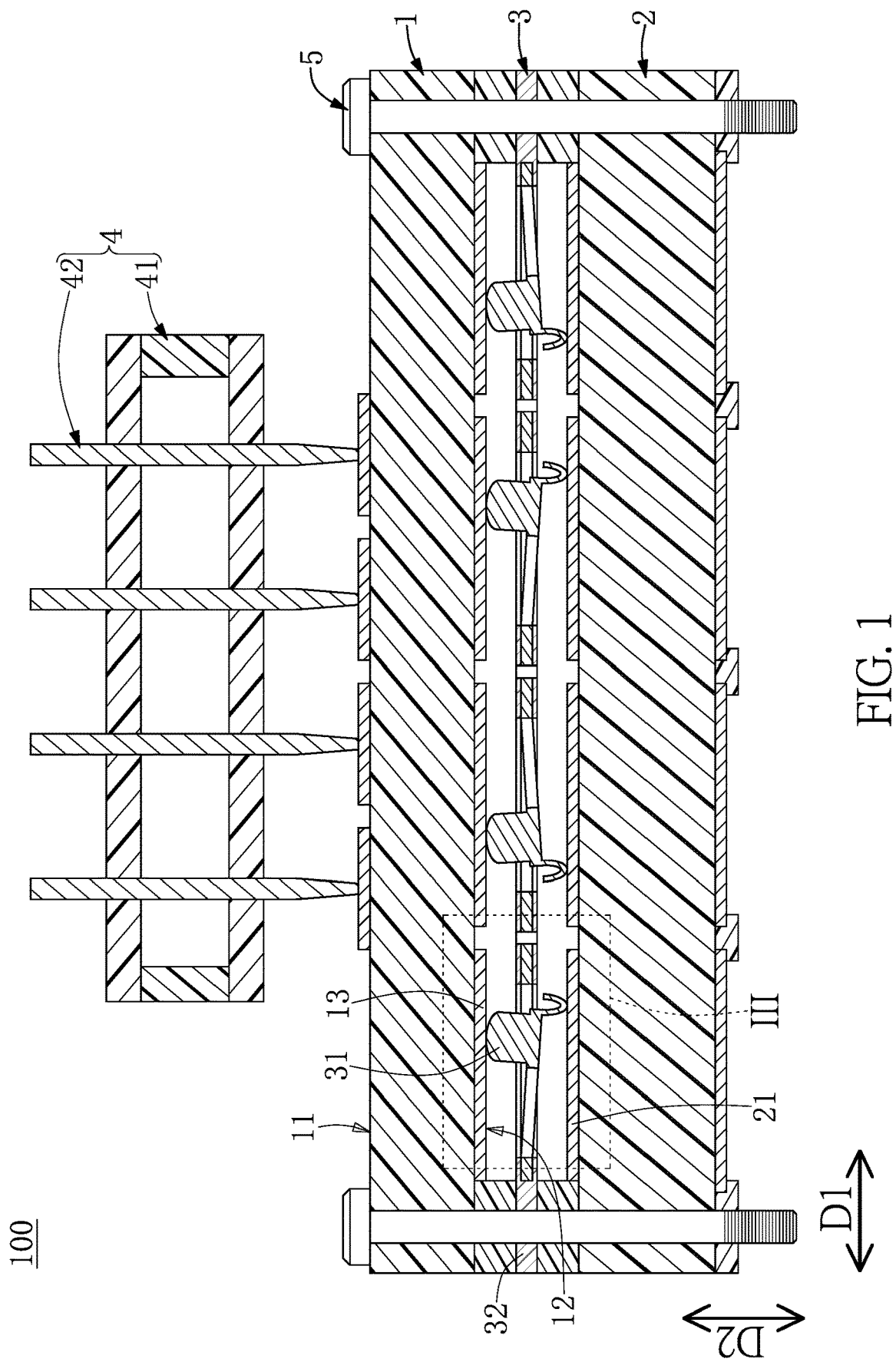
FIG. 1 is a cross-sectional view of a wafer testing assembly according to an embodiment of the present disclosure.

Referring to FIG. 1 to FIG. 12, an embodiment of the present disclosure provides a wafer testing assembly 100. It should be noted that a size and a quantity of any component of the wafer testing assembly 100 shown in FIG. 1 to FIG. 12 can be adjusted or changed according to design requirements (e.g., a length of any component can be increased, or the quantity of any component can be increased), and are not limited to the drawings.

As shown in FIG. 1 to FIG. 4, the wafer testing assembly 100 includes a signal transmission board 1 (that can be named as a space transformer 1), a testing circuit board 2 spaced apart from the signal transmission board 1, a board-like connector 3 sandwiched between the signal transmission board 1 and the testing circuit board 3, a probe head 4 connected to the signal transmission board 1, and a screw set 5.

In the present embodiment, the screw set 5 is inserted into the signal transmission board 1, the board-like connector 3, and the testing circuit board 2 so as to fix and maintain a relative position of the signal transmission board 1, the board-like connector 3, and the testing circuit board 2. Accordingly, any electrical path in the signal transmission board 1, the board-like connector 3, and the testing circuit board 2 of the present embodiment can be established without using any soldering material, but the present disclosure is not limited thereto. For example, in other embodiments of the present disclosure not shown in the drawings, the screw set 5 of the wafer testing assembly 100 can be omitted or can be replaced by other components (e.g., the components of the wafer testing assembly 100 can be fixed to each other in an adhering manner).

It should be noted that the board-like connector 3 in the present embodiment is described in cooperation with the signal transmission board 1, the testing circuit board 2, the probe head 4, and the screw set 5, but the present disclosure is not limited thereto. For example, in other embodiments of the present disclosure not shown in the drawings, the board-like connector 3 can be independently used (e.g., sold) or can be used in cooperation with other components (e.g., the board-like connector 3 can be provided for being sandwiched between two boards so as to allow the two boards are electrically coupled to each other by the board-like connector 3). The following description describes the structure and connection relationship of each component of the wafer testing assembly 100.

Figure 2:
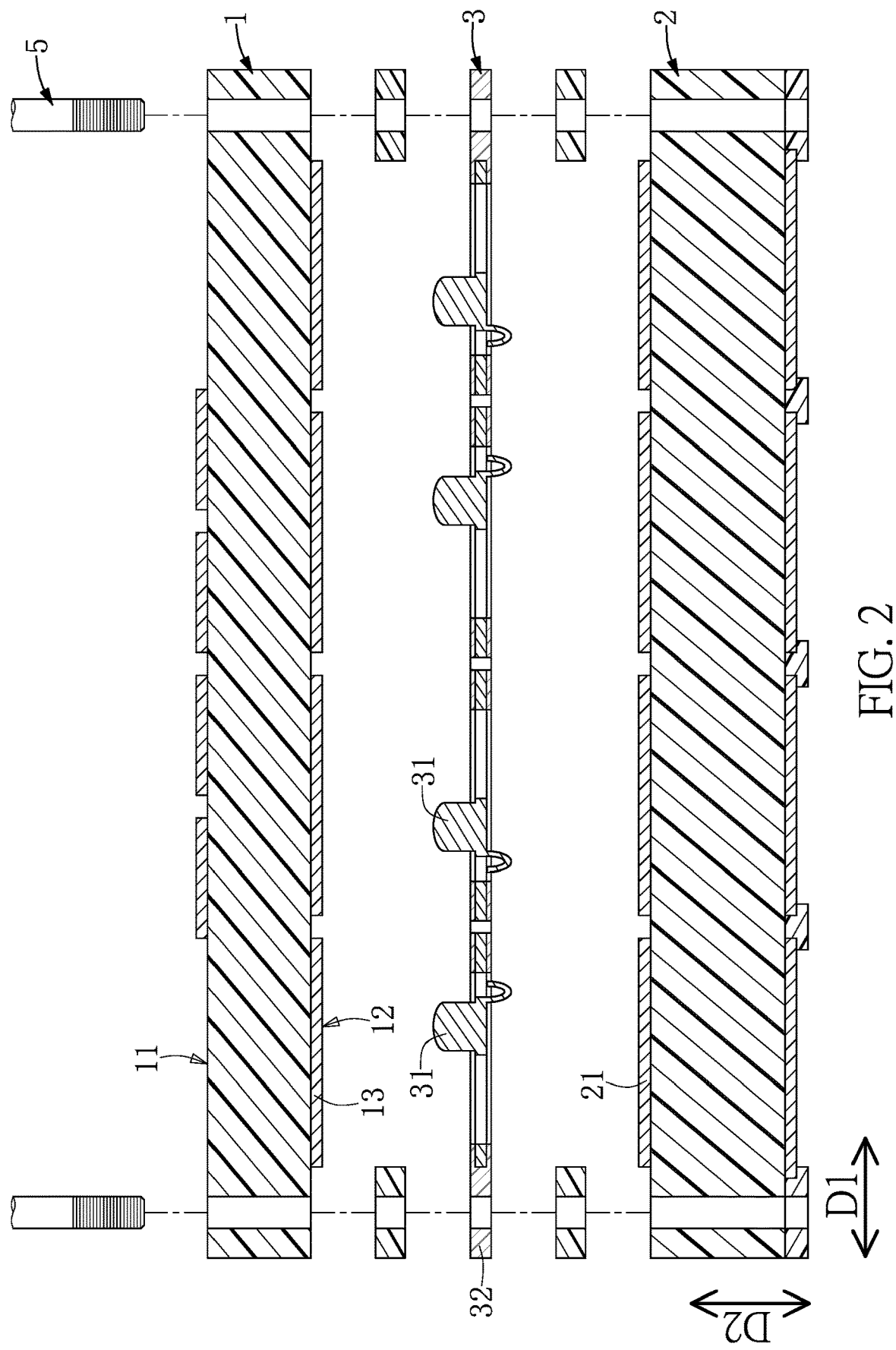
FIG. 2 is an exploded view of FIG. 1 when a probe head is omitted.

As shown in FIG. 1 and FIG. 2, the signal transmission board 1 has a top surface 11 and a bottom surface 12 that is opposite to the top surface 11. The top surface 11 of the signal transmission board 1 is configured to be connected to the probe head 4, and the bottom surface 12 of the signal transmission board 1 faces toward the board-like connector 3. The signal transmission board 1 includes a plurality of connection pads 13 arranged on the bottom surface 12 and provided to electrically couple to the probe head 4. Moreover, in other embodiments of the present disclosure not shown in the drawings, the signal transmission board 1 can be a multi-layer structure and can further include a functional board having an impedance matching effect.

The testing circuit board 2 is configured to be electrically coupled to a testing apparatus (not shown in the drawings). The testing circuit board 2 includes a plurality of metal pads 21 arranged on a board surface thereof (e.g., a top surface of the testing circuit board 2 shown in FIG. 2) and spaced apart from each other. The metal pads 21 of the testing circuit board 2 respectively correspond in position to the connection pads 13 of the signal transmission board 1, but the present disclosure is not limited thereto. Accordingly, the testing apparatus can be configured to analyze signals transmitted from the testing circuit board 2 by being electrically coupled to the metal pads 21. It should be noted that the electrical connection manner between the testing circuit board 2 and the testing apparatus can be adjusted or changed according to design requirements. For example, in other embodiments of the present disclosure not shown in the drawings, the testing circuit board 2 can be directly assembled into the testing apparatus.

The board-like connector 3 is sandwiched between the signal transmission board 1 and the testing circuit board 2, so that the signal transmission board 1 and the testing circuit board 2 are electrically coupled to each other through the board-like connector 3. A force generated by using the signal transmission board 1 and the testing circuit board 2 to jointly clamp the board-like connector 3 can be adjusted through the screw set 5. In other words, a distance between the signal transmission board 1 and the testing circuit board 2 can be adjusted through the screw set 5, thereby controlling the force applied to the board-like connector 3.

Figure 3:
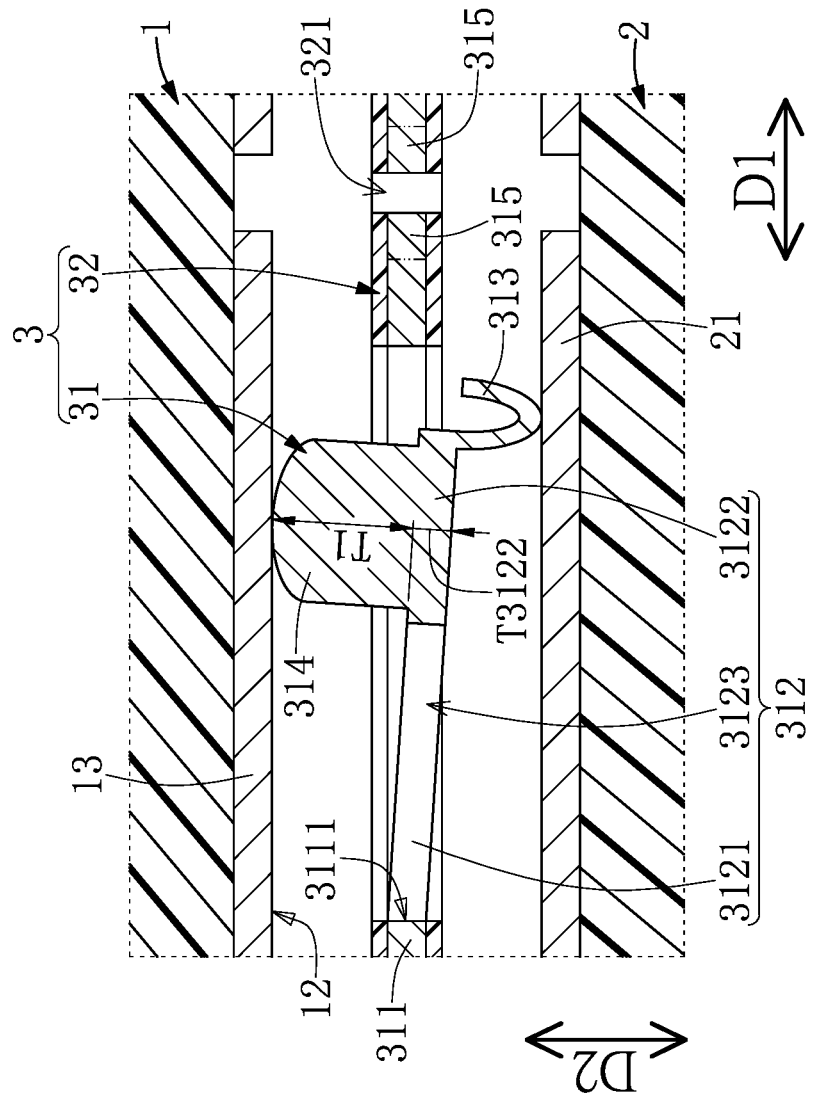
FIG. 3 shows an enlarged view of a part III of FIG. 1.
Figure 4:
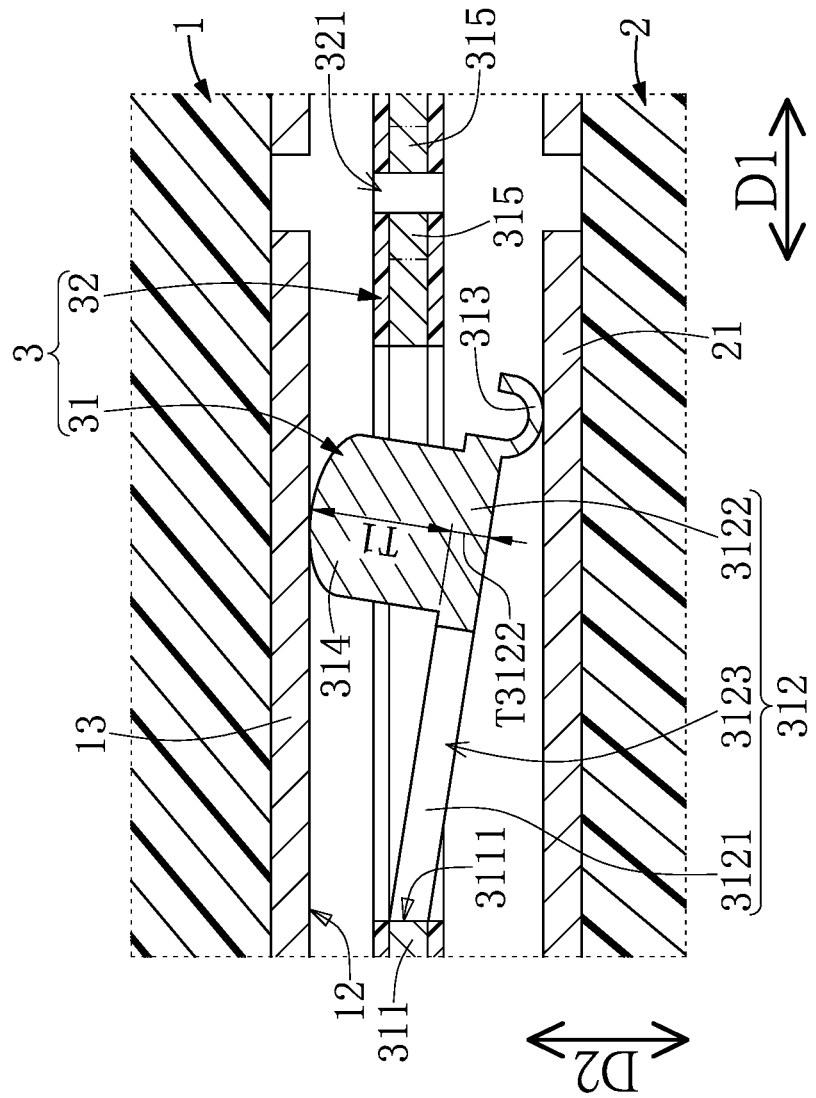
FIG. 4 shows an enlarged view of the part III of FIG. 1 in another configuration.

Specifically, as shown in FIG. 2 to FIG. 4, the board-like connector 3 includes a plurality of single-arm bridges 31 spaced apart from each other and an insulating layer 32 that fixes the single-arm bridges 31. It should be noted that the single-arm bridges 31 in the present embodiment are described in cooperation with the insulating layer 32, but the present disclosure is not limited thereto. For example, in other embodiments of the present disclosure not shown in the drawings, the single-arm bridge 31 can be independently used (e.g., sold) or can be used in cooperation with other components (e.g., the single-arm bridge 31 can be used in cooperation with other bridges; or, the single-arm bridge 31 can be provided for being sandwiched between two boards so as to allow the two boards are electrically coupled to each other by the single-arm bridge 31).

As the single-arm bridges 31 in the present embodiment are of the substantially same structure, the following description discloses the structure of just one of the single-arm bridges 31 for the sake of brevity, but the present disclosure is not limited thereto. For example, in other embodiments of the present disclosure, the single-arm bridges 31 can be of different structures. The following description describes the single-arm bridge 31 without receiving an external force.

Figure 5:
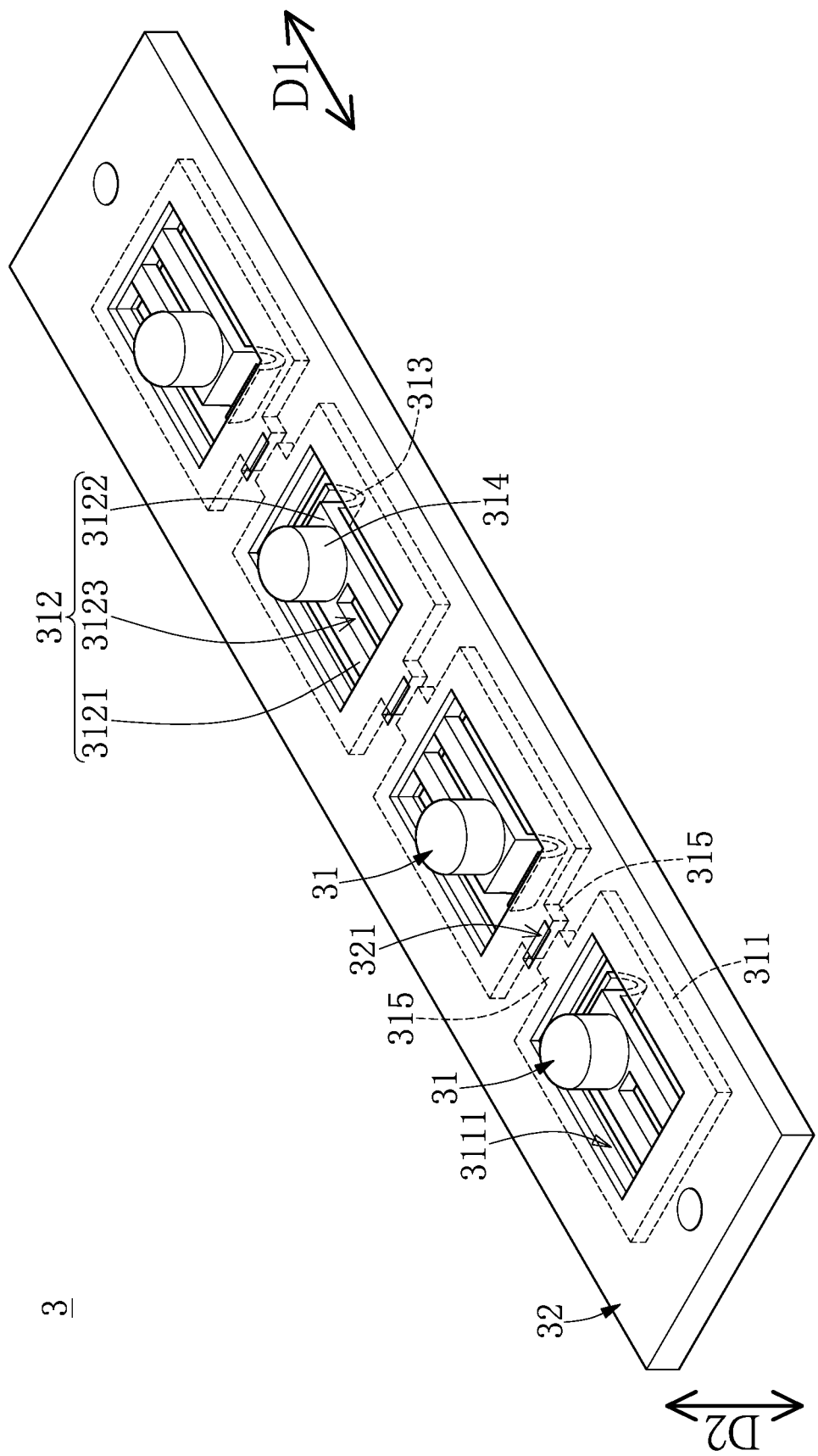
FIG. 5 is a perspective view of a board-like connector according to the embodiment of the present disclosure.
Figure 6:
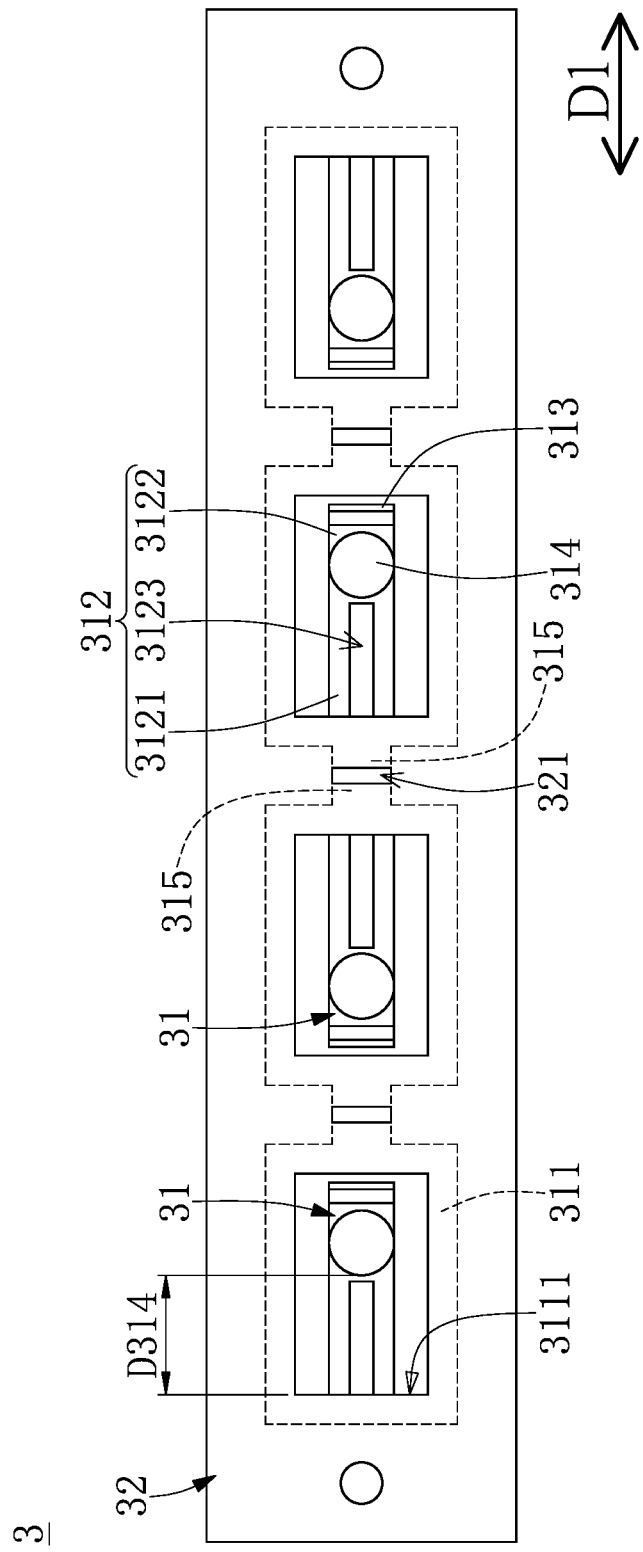
FIG. 6 is a top view of FIG. 5.
Figure 7:
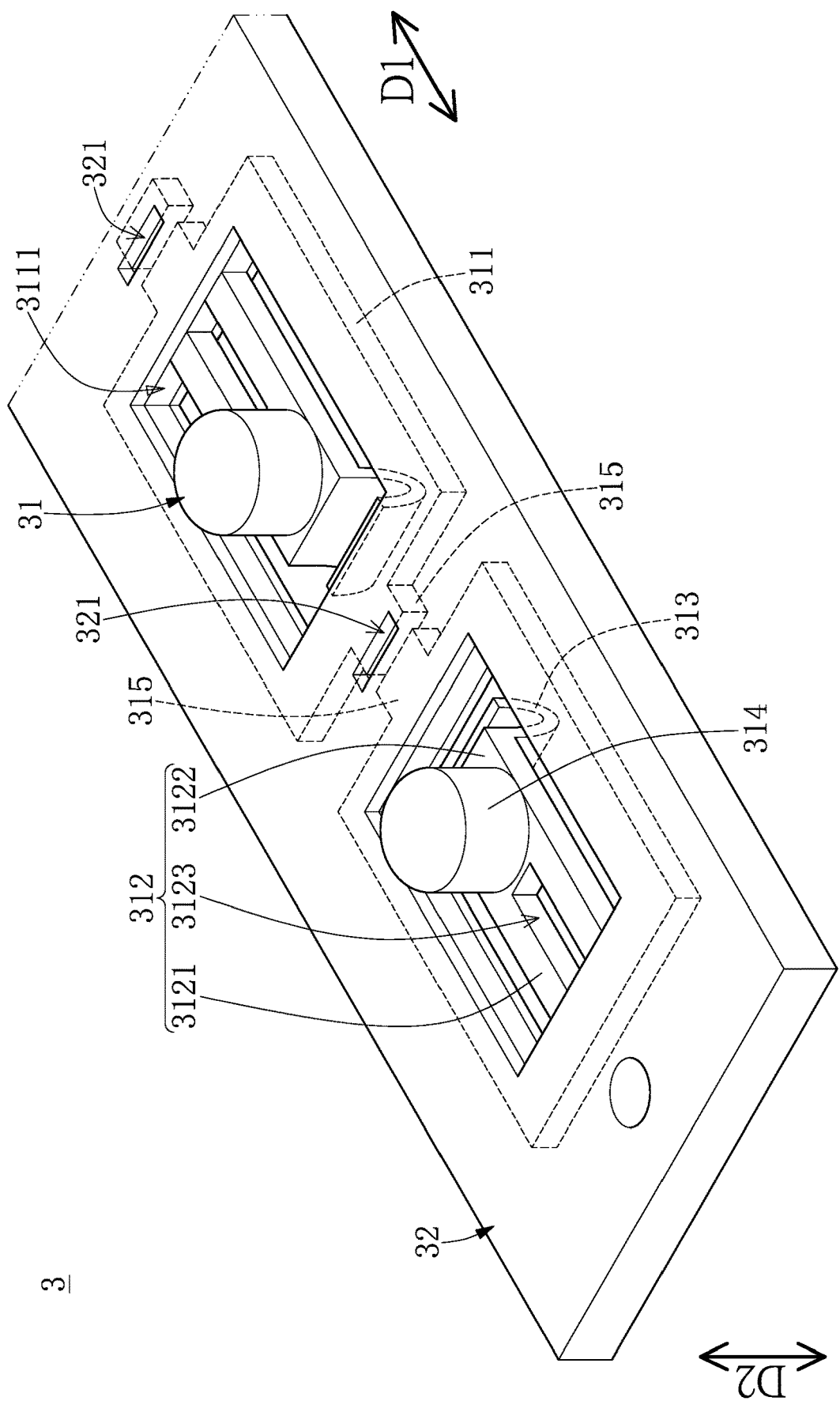
FIG. 7 is a perspective view showing a part of FIG. 5.

As shown in FIG. 5 to FIG. 7, the single-arm bridge 31 in the present embodiment is a single one-piece conductive structure, and a nickel gold layer is preferably coated on an outer surface of the single-arm bridge 31, but the present disclosure is not limited thereto. The single-arm bridge 31 includes a carrier 311 having a square or rectangle ring-shape, a cantilever 312 extending from an inner lateral wall 3111 of the carrier 311, an abutting end portion 313 curvedly extending from a distal end of the cantilever 312, an abutting column 314 extending from the cantilever 312, and at least one residual arm 315 that extends from an outer lateral wall of the carrier 311, but the present disclosure is not limited thereto.

Figure 8:
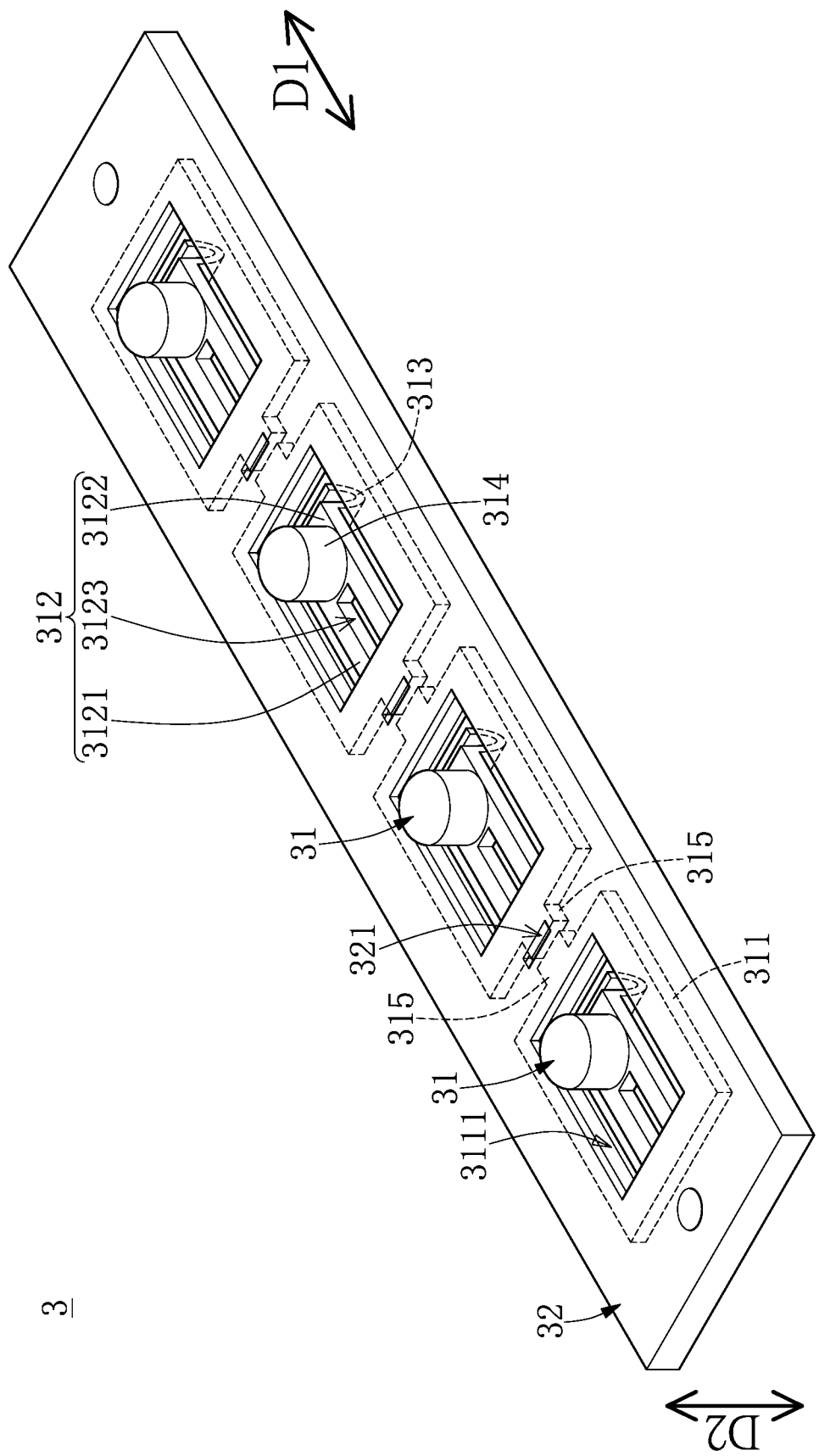
FIG. 8 is a perspective view showing the board-like connector in another configuration according to the embodiment of the present disclosure.
Figure 9:
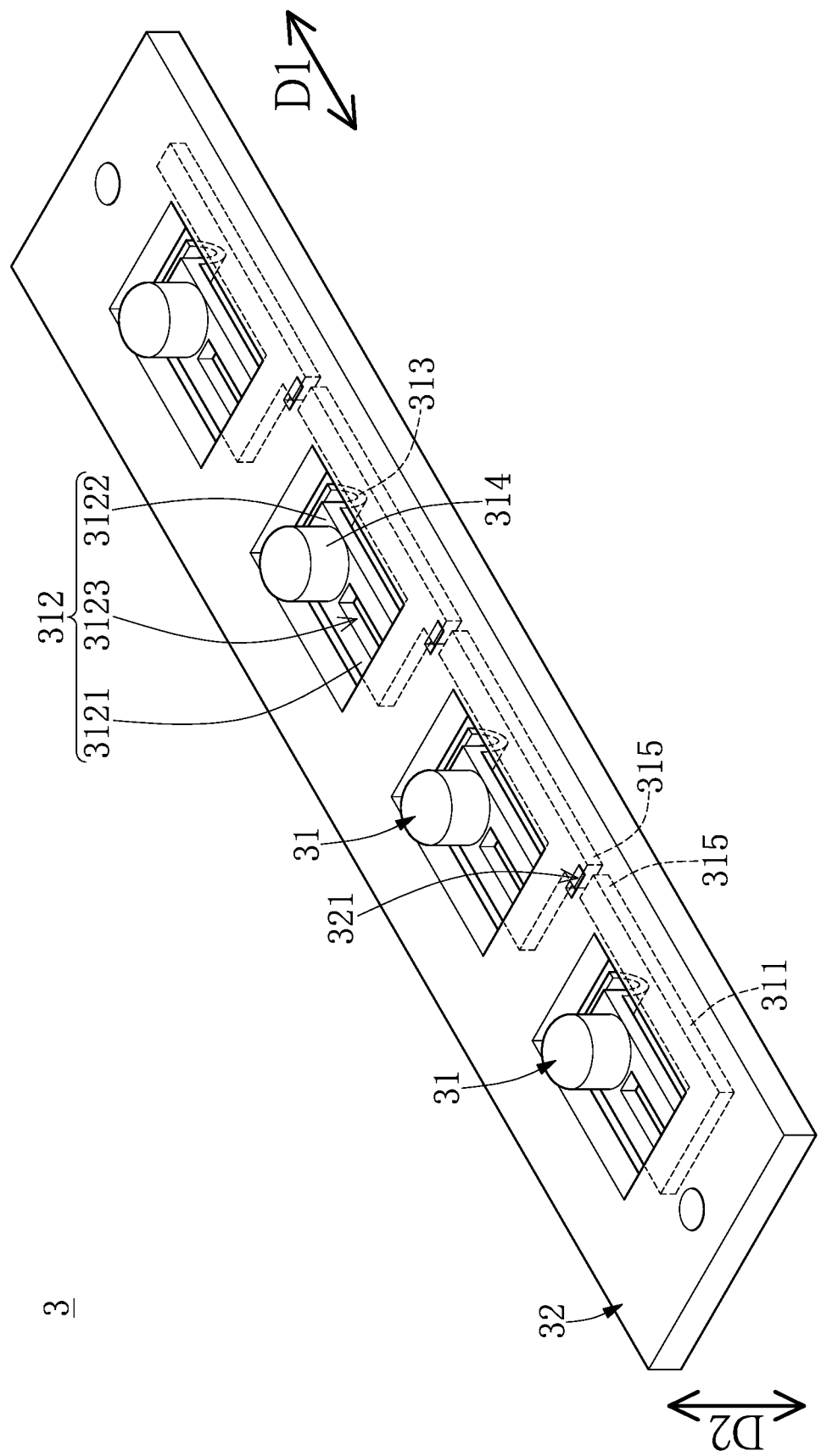
FIG. 9 is a perspective view showing the board-like connector in yet another configuration according to the embodiment of the present disclosure.

For example, in other embodiments of the present disclosure not shown in the drawings, the single-arm bridge 31 can be provided without the at least one residual arm 315; or, as shown in FIG. 8, any two of the cantilevers 312 adjacent to each other can be oriented along a same direction by being connected to the corresponding inner lateral walls 3111; or, as shown in FIG. 9, the carrier 311 can be not in a ring-shape.

In a reference embodiment different from the present disclosure and not shown in the drawings, at least one slanting cantilever is connected to a carrier by an angle, and when the at least one slanting cantilever is bent by receiving an external force, a stress would be concentrated on a connection part of the at least one slanting cantilever and the carrier, so that the at least one slanting cantilever is easily broken along the connection part.

However, in the present embodiment as shown in FIG. 5 to FIG. 7, the cantilever 312 extends from the inner lateral wall 3111 along a first direction D1 so as to be coplanar with the carrier 311. In other words, an upper surface of the cantilever 312 is coplanar with that of the carrier 311, and a lower surface of the cantilever 312 is coplanar with that of the carrier 311.

Accordingly, the cantilever 312 in the present embodiment is provided by being coplanar with the carrier 311 for increasing the manufacturing yield of the board-like connector 3, and when the cantilever 312 is bent by receiving an external force, a stress would be uniformly distributed on the cantilever 312, thereby effectively decreasing a breaking possibility of the cantilever 312 from the carrier 311. In other words, any cantilever not coplanar with a carrier is different from the cantilever 312 of the present embodiment.

Figure 10:
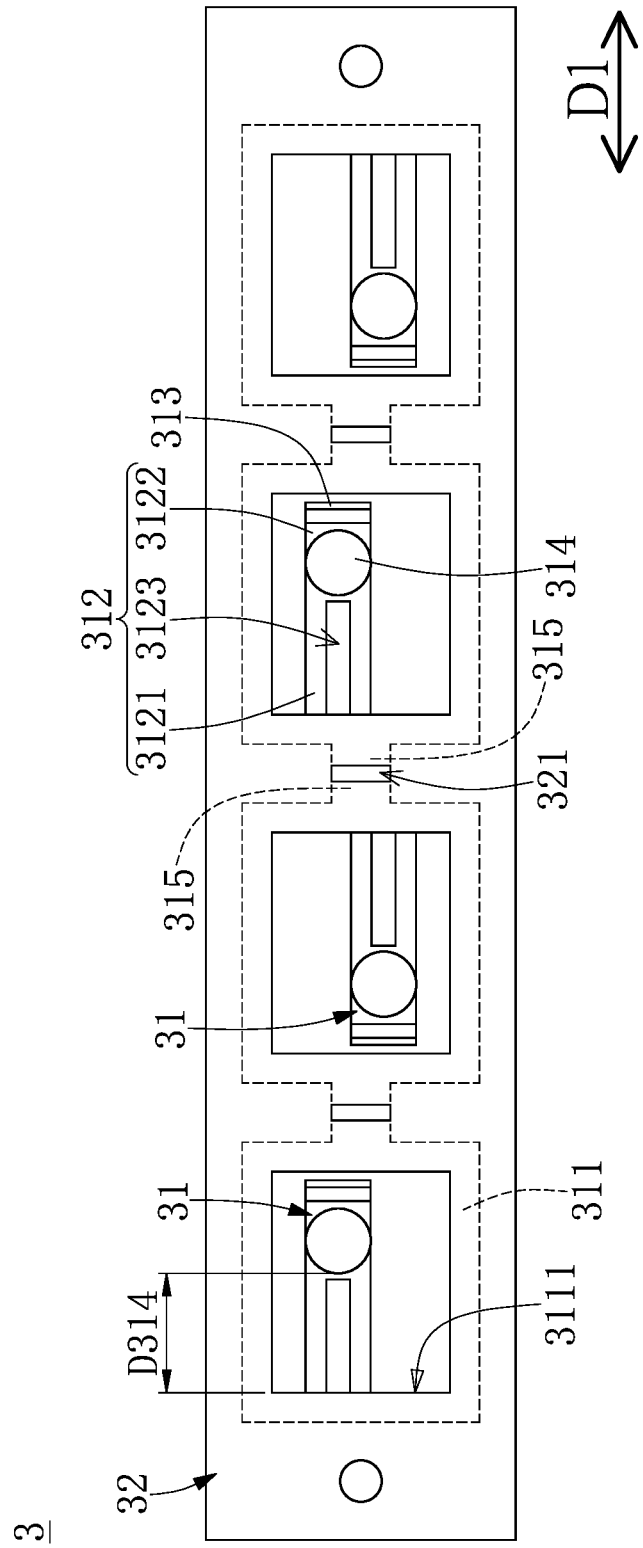
FIG. 10 is a top view showing the board-like connector in still yet another configuration according to the embodiment of the present disclosure.

Specifically, as shown in FIG. 5 to FIG. 7, any two of the cantilevers 312 adjacent to each other in the present embodiment can be connected to the inner lateral walls 3111 arranged at two opposite sides so as to be substantially in a 2-fold rotational symmetry with respect to the carrier 311, but the present disclosure is not limited thereto. For example, in other embodiments of the present disclosure not shown in the drawings, any two of the cantilevers 312 adjacent to each other can have different lengths according to design requirements; or, as shown in FIG. 10, any two of the cantilevers 312 adjacent to each other can be arranged not along a straight direction.

Moreover, as shown in FIG. 5 to FIG. 7, the abutting column 314 extends from the upper surface of the cantilever 312 along a second direction D2 perpendicular to the first direction D1. The abutting end portion 313 is spaced apart from the abutting column 314 along the first direction D1, and the abutting column 314 and the abutting end portion 313 are respectively arranged at two opposite sides of the cantilever 312 (e.g., an upper side and a lower side of the cantilever 312 shown in FIG. 5), but the present disclosure is not limited thereto.

Specifically, in order to allow the single-arm bridge 31 to have a better mechanical property and a better electrical transmission relative to the signal transmission board 1 and the testing circuit board 2, the single-arm bridge 31 is preferably provided with at least one following feature, but the present disclosure is not limited thereto. For example, in other embodiments of the present disclosure not shown in the drawings, the single-arm bridge 31 can be provided without any following feature.

In the present embodiment, any portion of the cantilever 312 has a same thickness, and the cantilever 312 includes an arm portion 3121 connected to the inner lateral wall 3111 and a free end portion 3122 that extends from the arm portion 3121. The arm portion 3121 has an adjustment hole 3123 penetrating there-through and extending from the free end portion 3122 to the inner lateral wall 3111, but the present disclosure is not limited thereto. For example, in other embodiments of the present disclosure not shown in the drawings, the adjustment hole 3123 can be spaced apart from the free end portion 3122 (or the inner lateral wall 3111) by a distance.

Accordingly, the arm portion 3121 in the present embodiment is divided into two arms through the adjustment hole 3123, thereby providing a better balance performance to the free end portion 3122. Moreover, an elastic force provided from the arm portion 3121 can be effectively controlled by changing a size or a shape of the adjustment hole 3123, thereby satisfying different design requirements.

The abutting column 314 is integrally connected to the free end portion 3122, and the abutting column 314 is spaced apart from the inner lateral wall 3111 by a distance D314 being within a range from 100 μm to 600 μm. In other words, a length of the abutting column 314 can be substantially within a range from 100 μm to 600 μm, but the present disclosure is not limited thereto. Moreover, a thickness T1 of the abutting column 314 with respect to the free end portion 3122 is 100% to 300% of a thickness T3122 of the free end portion 3122.

The abutting end portion 313 curvedly extends from the free end portion 3122, and the abutting end portion 313 can be elastically deformable or swingable relative to the cantilever 312, but the present disclosure is not limited thereto. The abutting end portion 313 in the present embodiment is a V-shaped or U-shaped structure outwardly extending from the free end portion 3122, but in other embodiments of the present disclosure not shown in the drawings, the abutting end portion 313 can be other structures according to design requirements (e.g., the abutting end portion 313 inwardly extends from the free end portion 3122 so as to be at least partially located under the free end portion 3122).

Figure 11:
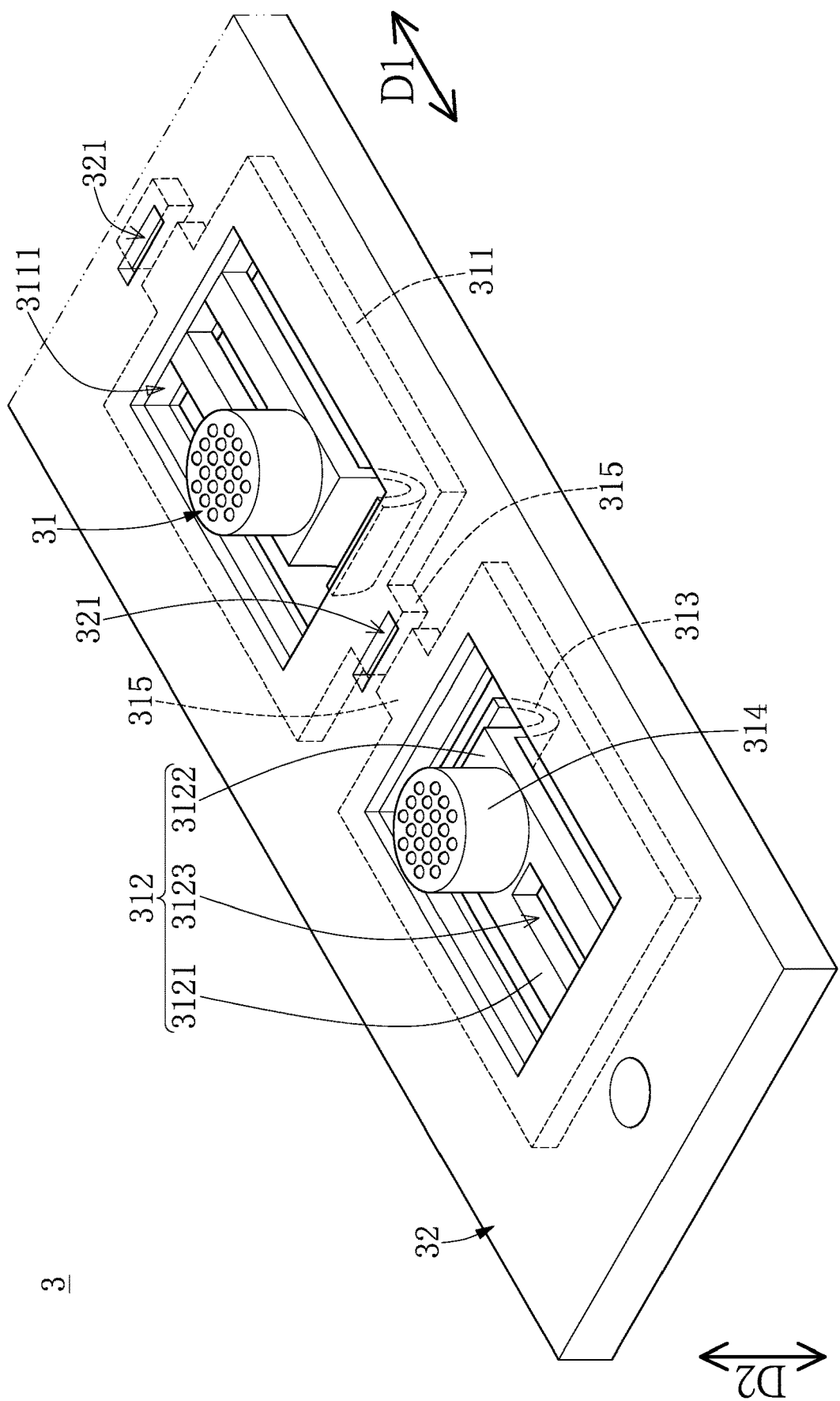
FIG. 11 is a perspective view showing a single-arm bridge of the board-like connector in another configuration according to the embodiment of the present disclosure.

In addition, the single-arm bridge 31 can abut against two boards (e.g., the signal transmission board 1 and the testing circuit board 2) through the abutting column 314 and the abutting end portion 313, respectively. A structure of the abutting column 314 configured to abut against one of the two boards in the present embodiment is an arced surface that can be adjusted or changed according to design requirements, and the present disclosure is not limited thereto. For example, in other embodiments of the present disclosure not shown in the drawings, the structure of the abutting column 314 can be a slanting surface; or, as shown in FIG. 11, the structure of the abutting column 314 can include a plurality of protrusions.

The insulating layer 32 in the present embodiment is made of a high-temperature resistant material (e.g., the insulating layer 32 can be made of a plastic material withstanding at least 300 degrees Celsius). The insulating layer 32 connects the carrier 311 and the residual arm 315 of each of the single-arm bridges 31. In the present embodiment, the insulating layer 32 can be connected to the carrier 311 and the residual arm 315 of each of the single-arm bridges 31 in a molding manner or an adhering manner, so that the carrier 311 and at least part of the residual arm 315 of each of the single-arm bridges 31 are embedded in the insulating layer 32.

Moreover, the abutting column 314 and the abutting end portion 313 of each of the single-arm bridges 31 can respectively protrude from two opposite sides (or two opposite surfaces) of the insulating layer 32, but the present disclosure is not limited thereto. For example, in other embodiments of the present disclosure not shown in the drawings, the abutting column 314 of each of the single-arm bridges 31 protrudes from the insulating layer 32, but the abutting end portion 313 of each of the single-arm bridges 31 is located in a space surroundingly defined by the insulating layer 32.

Specifically, the insulating layer 32 has a plurality of separation holes 321 penetrating there-through, any two of the single-arm bridges 31 adjacent to each other are provided with one of the separation holes 321 there-between, and a free end of the at least one residual arm 315 of each of the single-aim bridges 31 is exposed from one of the separation holes 321. In other words, before the separation holes 321 are formed in the insulating layer 32 of the board-like connector 3, at least two of the residual arms 315 of any two of the single-arm bridges 31 are connected to each other, thereby facilitating the manufacturing of the single-arm bridges 31. After that, the at least two of the residual arms 315 connected to each other can be cut off to be electrically isolated to each other by forming the separation holes 321 in the insulating layer 32.

The above description describes the structure of each of the signal transmission board 1, the testing circuit board 2, and the board-like connector 3, and the following description describes the connection relationship of the signal transmission board 1, the testing circuit board 2, and the board-like connector 3. The abutting columns 314 of the single-arm bridges 31 respectively abut against the connection pads 13 of the signal transmission board 1, and the abutting end portions 313 of the single-arm bridges 31 respectively abut against the metal pads 21 of the testing circuit board 2.

Figure 12:
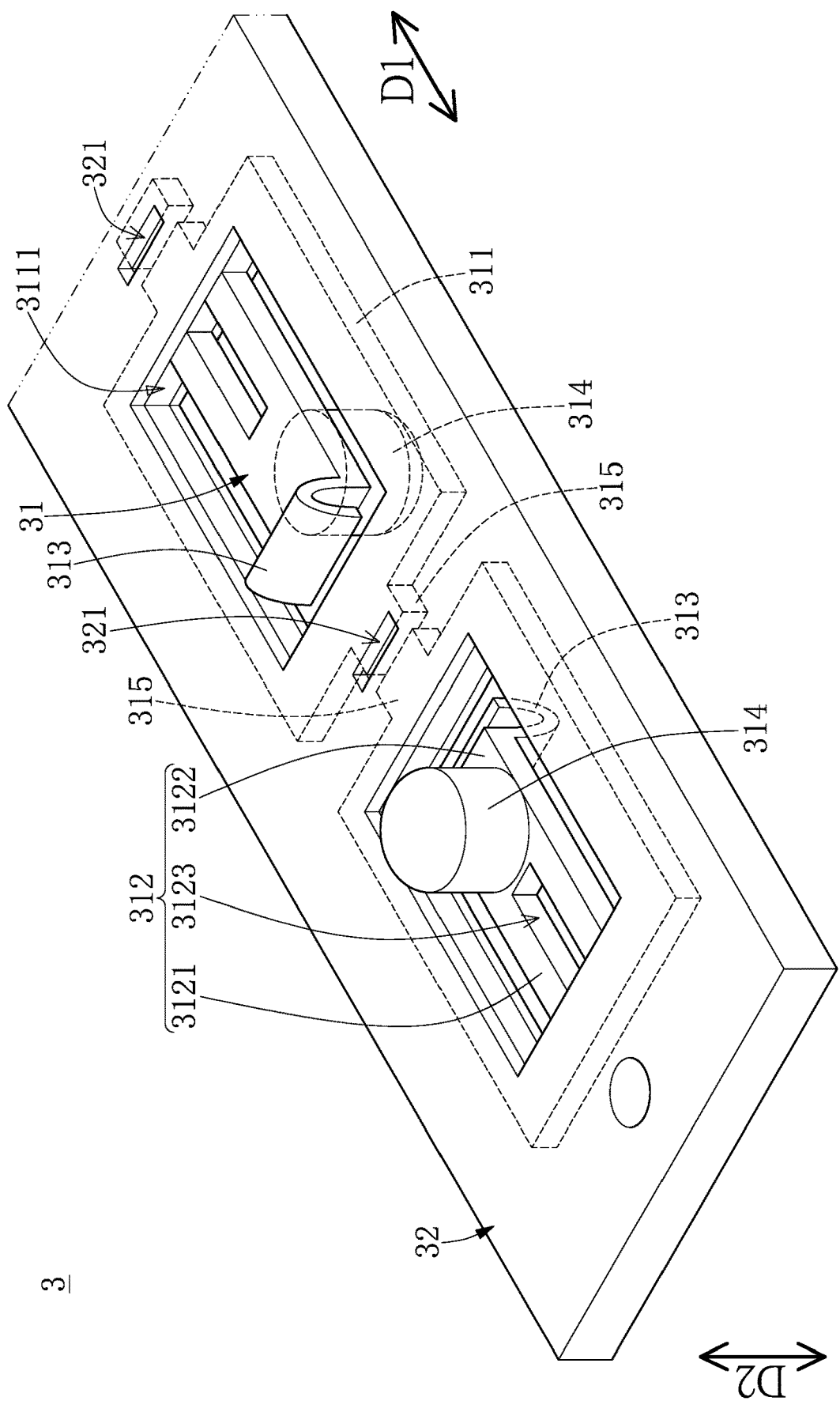
FIG. 12 is a perspective view showing a single-arm bridge of the board-like connector in yet another configuration according to the embodiment of the present disclosure.

In other words, the abutting column 314 of any one of the single-arm bridges 31 abuts against one of the two boards, and the abutting end portion 313 of any one of the single-arm bridges 31 abuts against another one of the two boards, but the present disclosure is not limited thereto. For example, as shown in FIG. 12, the abutting columns 314 can be formed by extending along the second direction D2 from the cantilevers 312 toward different sides (e.g., the upper side and the lower side shown in FIG. 12), and the abutting column 314 and the abutting end portion 313 of each of the single-arm bridges 31 are respectively arranged at two opposite sides of the cantilever 312 (e.g., the upper side and the lower side of the cantilever 312 shown in FIG. 12). In other words, the abutting columns 314 and the abutting end portions 313 of the single-arm bridges 31 are configured to abut against the two boards (e.g., the signal transmission board 1 and the testing circuit board 2).

Moreover, as shown in FIG. 1 and FIG. 2, in any one of the single-arm bridges 31 of the present embodiment, the signal transmission board 1 and the testing circuit board 2 clamp the abutting column 314 and the abutting end portion 313, so that the cantilever 312 is elastically bent to allow two opposite ends of the abutting column 314 to respectively protrude from the two opposite sides of the insulating layer 32 (shown in FIG. 4), thereby effectively decreasing a thickness of the board-like connector 3, but the present disclosure is not limited thereto. For example, the force generated by using the signal transmission board 1 and the testing circuit board 2 to jointly clamp the board-like connector 3 can be adjusted according to design requirements (shown in FIG. 3).

As shown in FIG. 1, the probe head 4 is disposed on the top surface 11 of the signal transmission board 1, and the probe head 4 can be electrically coupled to the testing circuit board 2 through the signal transmission board 1 and the board-like connector 3. The probe head 4 includes a retainer 41 and a plurality of conductive probes 42 that pass through and are retained by the retainer 41. An end of each of the conductive probes 42 (e.g., a bottom end of each of the conductive probes 42 shown in FIG. 1) passes through the retainer 41 and abuts against the top surface 11 of the signal transmission board 1, and another end of each of the conductive probes 42 (e.g., a top end of each of the conductive probes 42 shown in FIG. 1) passes through the retainer 41 and is configured to detachably abut against a device under test (DUT) (e.g., a semi-conductor wafer). It should be noted that the conductive probe 42 of the present embodiment is an elongated structure being conductive and flexible, and the conductive probe 42 of the present embodiment is not limited to a rectangular probe, a round probe, or other probes. In addition, the probe head 4 of the present embodiment is a vertical probe head, but the specific structure of the probe head 4 can be adjusted or changed according to design requirements and is not limited to the present embodiment.

Beneficial Effects of the Embodiment

In conclusion, in the wafer testing assembly (or the board-like connector) of the present disclosure, the abutting column and the abutting end portion of any one of the single-arm bridges elastically abut against the two boards (e.g., the signal transmission board and the testing circuit board) by being in cooperation with the cantilever, thereby without using any soldering manner. Moreover, any one of the single-arm bridges is detachably abutting against the two boards, so that the components of the wafer testing assembly can be easily separated from each other for facilitating the inspection and maintenance of the wafer testing assembly.

Specifically, in the wafer testing assembly (or the board-like connector) of the present disclosure, the cantilever of any one of the single-arm bridges is coplanar with the carrier for increasing the manufacturing yield of the board-like connector, and when the cantilever of any one of the single-arm bridges is bent by receiving an external force, a stress would be uniformly distributed on the cantilever, thereby effectively decreasing the breaking possibility of the cantilever from the carrier.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer testing assembly, comprising:
   a signal transmission board configured to be connected to a probe head;
   a testing circuit board configured to be electrically coupled to a testing apparatus; and
   a board-like connector sandwiched between the signal transmission board and the testing circuit board, wherein the board-like connector includes:
   a plurality of single-arm bridges spaced apart from each other, wherein each of the single-arm bridges includes:
   a carrier;
   a cantilever extending from an inner lateral wall of the carrier along a first direction and being coplanar with the carrier;
   an abutting column extending from the cantilever along a second direction perpendicular to the first direction; and
   an abutting end portion curvedly extending from a distal end of the cantilever, wherein the abutting end portion is spaced apart from the abutting column along the first direction; and an insulating layer connecting the carriers of the single-arm bridges, wherein the abutting column of each of the single-arm bridges protrudes from the insulating layer;

wherein the abutting columns of the single-arm bridges abut against one of the signal transmission board and the testing circuit board, and the abutting end portions of the single-arm bridges abut against another one of the signal transmission board and the testing circuit board;

wherein the signal transmission board and the testing circuit board are electrically coupled to each other through the board-like connector.

2. The wafer testing assembly according to claim 1, wherein in any one of the single-arm bridges, the cantilever includes an arm portion connected to the inner lateral wall and a free end portion that extends from the arm portion, the abutting column is integrally connected to the free end portion, the abutting end portion curvedly extends from the free end portion, and the abutting column is spaced apart from the inner lateral wall by a distance being within a range from 100 μm to 600 μm.

3. The wafer testing assembly according to claim 2, wherein in any one of the single-arm bridges, the arm portion has an adjustment hole penetrating there-through and extending from the free end portion to the inner lateral wall.

4. The wafer testing assembly according to claim 2, wherein in any one of the single-arm bridges, the abutting column has a thickness with respect to the free end portion, and the thickness of the abutting column is 100% to 300% of a thickness of the free end portion.

5. The wafer testing assembly according to claim 1, further comprising a screw set that is inserted into the signal transmission board, the board-like connector, and the testing circuit board so as to fix and maintain a relative position of the signal transmission board, the board-like connector, and the testing circuit board, wherein any electrical path in the signal transmission board, the board-like connector, and the testing circuit board is established without using any soldering material.

6. The wafer testing assembly according to claim 1, wherein the insulating layer has a plurality of separation holes penetrating there-through, each of the single-arm bridges includes at least one residual arm extending from an outer lateral wall of the carrier, and a free end of the at least one residual arm of each of the single-arm bridges is exposed from one of the separation holes.

7. The wafer testing assembly according to claim 6, wherein any two of the single-arm bridges adjacent to each other are provided with one of the separation holes there-between.

8. The wafer testing assembly according to claim 1, wherein in any one of the single-aim bridges, the signal transmission board and the testing circuit board clamp the abutting column and the abutting end portion, so that the cantilever is elastically bent to allow two opposite ends of the abutting column to respectively protrude from two opposite sides of the insulating layer.

9. A board-like connector for being sandwiched between two boards so as to allow the two boards are electrically coupled to each other by the board-like connector, the board-like connector comprising:

a plurality of single-arm bridges spaced apart from each other, wherein each of the single-arm bridges includes:
a carrier;
a cantilever extending from an inner lateral wall of the carrier along a first direction and being coplanar with the carrier;
an abutting column extending from the cantilever along a second direction perpendicular to the first direction; and
an abutting end portion curvedly extending from a distal end of the cantilever, wherein the abutting end portion is spaced apart from the abutting column along the first direction; and
an insulating layer connecting the carriers of the single-arm bridges, wherein the abutting column of each of the single-arm bridges protrudes from the insulating layer;
wherein the abutting columns and the abutting end portions of the single-arm bridges are configured to abut against the two boards.

10. A single-arm bridge of a board-like connector for being sandwiched between two boards so as to allow the two boards are electrically coupled to each other by the single-arm bridge, the single-arm bridge comprising:
a carrier;
a cantilever extending from an inner lateral wall of the carrier along a first direction and being coplanar with the carrier;
an abutting column extending from the cantilever along a second direction perpendicular to the first direction; and
an abutting end portion curvedly extending from a distal end of the cantilever, wherein the abutting end portion is spaced apart from the abutting column along the first direction; and
wherein the abutting column of the single-arm bridge is configured to abut against one of the two boards, and the abutting end portion of the single-arm bridge is configured to abut against another one of the two boards.

* * * * *